United States Patent
Martin et al.

(10) Patent No.: US 10,908,215 B2
(45) Date of Patent: Feb. 2, 2021

(54) MONITORING UNIT FOR MONITORING AN ELECTRICAL CIRCUIT BREAKER AND CIRCUIT BREAKER COMPRISING SUCH A MONITORING UNIT

(71) Applicant: Schneider Electric Industries SAS, Rueil Malmaison (FR)

(72) Inventors: Willy Martin, Vaulnaveys le Haut (FR); Thierry Ourth, Vif (FR); Olivier Theron, Montbonnot (FR); Theo Deletang, Sept-Forges (FR); Vincent Lababsa, La Buisse (FR); Patrick Prieur, Fontaine (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 341 days.

(21) Appl. No.: 15/677,184

(22) Filed: Aug. 15, 2017

(65) Prior Publication Data

US 2018/0059185 A1  Mar. 1, 2018

(30) Foreign Application Priority Data

Aug. 31, 2016 (FR) ..................... 16 58076

(51) Int. Cl.
*G01R 31/327* (2006.01)
*H01H 71/02* (2006.01)
(Continued)

(52) U.S. Cl.
CPC ....... *G01R 31/3274* (2013.01); *G01R 31/327* (2013.01); *H01B 1/026* (2013.01); *H01H 71/0228* (2013.01); *H01R 13/665* (2013.01)

(58) Field of Classification Search
CPC ............. H01H 71/125; H01H 71/7409; H01H 2071/0242
See application file for complete search history.

(56) References Cited

U.S. PATENT DOCUMENTS 2,755,358 A * 7/1956 Dobes ................ H01H 71/1054
337/102
5,331,500 A 7/1994 Corcoles et al.
(Continued)

FOREIGN PATENT DOCUMENTS

EP 2 079 091 A1 7/2009
EP 2 590 198 A1 5/2013
(Continued)

OTHER PUBLICATIONS

French Preliminary Search Report dated May 23, 2017 in French Application 18 58076, filed on Aug. 31, 2016 (English Translation of Categories of Cited Documents).

*Primary Examiner* — Son T Le
*Assistant Examiner* — Adam S Clarke
(74) *Attorney, Agent, or Firm* — Oblon, McClelland, Maier & Neustadt, L.L.P.

(57) ABSTRACT

This monitoring unit (1) for monitoring an electrical circuit breaker (D) includes:
a central body including:
an interconnection device (120) capable of receiving primary voltages (V1) from the circuit breaker, and comprising an electrical power circuit (1220) for converting the primary voltages to secondary voltages (V2);
a control device (110), for measuring the secondary voltages (V2) delivered by the power circuit (1220),
a removable electrical power supply module (20), comprising a power converter (203), configured to transform the collected primary voltages (V1) into an additional secondary voltage (V2') and to supply electrical power to a shared electrical power supply bus (1102) of the control device (110).

14 Claims, 7 Drawing Sheets

(51) Int. Cl.
*H01B 1/02* (2006.01)
*H01R 13/66* (2006.01)

(56) References Cited

U.S. PATENT DOCUMENTS

| | | | |
|---|---|---|---|
| 5,877,691 A * | 3/1999 | Suptitz | H01H 71/0228 |
| | | | 340/638 |
| 5,945,650 A | 8/1999 | Holland et al. | |
| 5,982,652 A * | 11/1999 | Simonelli | H05K 7/1492 |
| | | | 363/142 |
| 6,329,810 B1 | 12/2001 | Reid | |
| 2006/0044846 A1* | 3/2006 | Hjort | H02J 9/062 |
| | | | 363/34 |
| 2006/0077607 A1* | 4/2006 | Henricks | H02J 13/00001 |
| | | | 361/93.1 |
| 2009/0190289 A1 | 7/2009 | Bellotto et al. | |
| 2014/0097758 A1* | 4/2014 | Recker | H05B 47/19 |
| | | | 315/152 |
| 2014/0318936 A1 | 10/2014 | Freyermuth et al. | |
| 2015/0002246 A1 | 1/2015 | Houbre | |
| 2015/0288225 A1* | 10/2015 | Dent | H02M 1/36 |
| | | | 307/66 |
| 2016/0133421 A1 | 5/2016 | Martin | |

FOREIGN PATENT DOCUMENTS

| | | |
|---|---|---|
| EP | 2 822 018 A1 | 1/2015 |
| EP | 3 018 691 A1 | 5/2016 |

* cited by examiner

MONITORING UNIT FOR MONITORING AN ELECTRICAL CIRCUIT BREAKER AND CIRCUIT BREAKER COMPRISING SUCH A MONITORING UNIT

The invention relates to a monitoring unit for monitoring a multipolar electrical circuit breaker.

Electrical circuit breakers including an electronic monitoring unit are known. A monitoring unit of this kind is typically programmed to measure, in real time, an operating state of the circuit breaker, and to control the opening of the circuit breaker in the event of a circuit breaker operating fault. A monitoring unit of this kind includes an electric power supply module provided with a power converter, which is electrically powered from input terminals of the circuit breaker, so as to collect primary electrical voltages associated with the electric current that passes through the circuit breaker. This power converter is furthermore designed to transform these primary electrical voltages into a secondary voltage that is used to electrically power the control device.

One drawback of these known monitoring units is that it is not possible to withdraw the electric power supply module comprising power circuits without having a negative effect on the operation of the monitoring unit of the circuit breaker. This complicates the performance of maintenance operations in the event of a fault, thereby reducing the reliability of the monitoring unit.

The invention aims more particularly to overcome these drawbacks by providing a monitoring unit for monitoring a multipolar electrical circuit breaker having a modular design, wherein the electric power supply module may be withdrawn or replaced without compromising the operation of the monitoring unit of the circuit breaker over time, while guaranteeing satisfactory electrical safety for the monitoring unit.

To this end, the invention relates to a monitoring unit for monitoring a multipolar electrical circuit breaker including:
a central body including:
an interconnection device comprising:
input contact pads able to be connected electrically to power input terminals of a multipolar electrical circuit breaker, for receiving primary electrical voltages from the circuit breaker,
an electrical power circuit including a voltage divider bridge, configured to convert the primary electrical voltages to secondary electrical voltages;
a control device, provided with a measuring circuit able to measure the secondary electrical voltages supplied by the electrical power circuit, the control device being programmed to determine an operating state of the circuit breaker depending on the secondary electrical voltages measured by the measuring circuit;
a removable electric power supply module, received in a recess of the central body, this module:
being connected electrically to the interconnection device in order to collect the primary electrical voltages, and
comprising a power converter, configured to transform the collected primary electrical voltages into an additional secondary voltage and to supply electric power to a shared electric power supply bus of the control device using this additional secondary voltage.

By virtue of the invention, the power supply module may be withdrawn without affecting the operation of the control device, in particular without preventing the latter from supervising the operation of the circuit breaker. A modular structure of this kind makes it possible to replace a faulty power supply module without having to replace the entire monitoring unit. This is made possible by the fact that the electrical power circuit, which conditions the secondary electrical voltages that are used by the measuring circuit, is separate from the power converter that is fitted on the removable electric power supply module.

The interconnection device furthermore ensures satisfactory electrical isolation between the parts of the monitoring unit that are in contact with the primary voltages and those that are in contact with the secondary voltages.

According to advantageous but non-mandatory aspects of the invention, the monitoring unit includes one or more of the following features, implemented in any technically permissible combination:
the interconnection device includes a support on which the electrical power circuit is arranged, the input contact pads being positioned on an edge of the support, and the interconnection device includes longitudinal insulation screens arranged along the support, starting from said edge of the support and extending perpendicularly with respect to the plane of the support, so as to separate the input contact pads transversely from one another;
the longitudinal insulation screens extend over at least 50% of the length of the support;
the divider bridge includes electrical resistors linked electrically to one another along rows so as to form separate branches of the electrical power circuit, each branch being associated with an electrical phase, and the longitudinal insulation screens extend in parallel with the rows of resistors so as to separate these branches transversely from one another;
the unit includes a removable wire-to-board connector for electrically connecting the input contact pads to electrical cables that are able to be connected electrically to power input terminals of the circuit breaker, this wire-to-board connector including a housing in which recesses are formed, inside which recesses the input contact pads are received when the connector is in a position connected to the interconnection device, these recesses being separated from one another over part of their length by external spacings having a shape that is complementary to the longitudinal insulation screens;
the interconnection device includes:
output contact pads of the electrical power circuit, arranged on the same face of the support as the input contact pads, and
an insulation wall intercalated between the input contact pads and the output contact pads and extending perpendicularly to said face;
the interconnection device includes unitary flexible-strip electrical connectors designed to be connected electrically to a primary connection interface of the removable power supply module;
the unitary flexible-strip connectors are made of a copper-beryllium alloy;
the monitoring unit includes additional removable modules able to be connected electrically to the control device, the monitoring unit including, to this end, electrical piston connectors that are designed to be connected to corresponding connectors fitted on these additional modules.

According to another aspect, the invention relates, finally, to a multipolar electrical circuit breaker including a monitoring unit according to the invention, the interconnection device being connected electrically to power terminals of the circuit breaker.

The invention will be better understood and other advantages thereof will become more clearly apparent in the light of the following description of an embodiment of a monitoring unit for monitoring a multipolar electrical circuit breaker, given solely by way of example and with reference to the appended drawings, in which:

FIGS. 1 and 2 show a monitoring unit 1 for monitoring a multipolar circuit breaker.

In a known manner, a multipolar electrical circuit breaker includes, for each electrical pole, power input and output terminals, which are selectively electrically connected to or isolated from one another by mobile contacts that may be separated from the circuit breaker.

Figure 3:
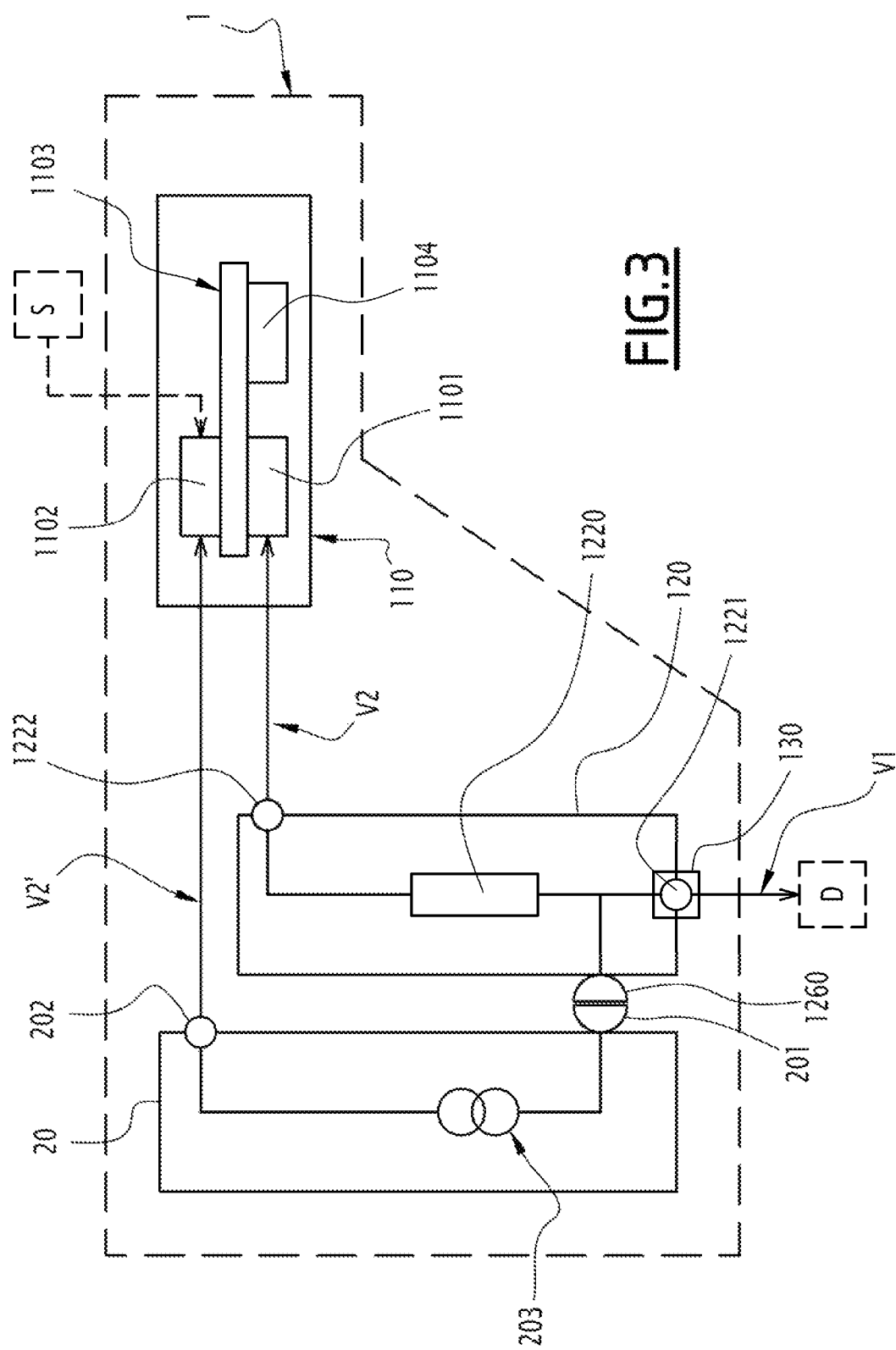
FIG. 3 is a simplified schematic overview of the operation of an electrical assembly including the monitoring unit from FIGS. 1 and 2.

The unit 1 is intended to be associated with a circuit breaker D of this kind, visible in FIG. 3, so as to control the opening of the circuit breaker, that is to say the separation of the power input and output terminals of each pole, if an operating defect such as an overcurrent or a short circuit is detected, in order to prevent the electric current from flowing between these terminals.

In this example, the unit 1 is associated with the circuit breaker D so as to form an electrical assembly. The circuit breaker D then includes the unit 1.

The monitoring unit 1 is also advantageously configured to measure physical quantities representative of the current that flows in the circuit breaker D, with a view to establishing statistics regarding the operation of the circuit breaker D, for example to determine electric currents, electrical voltages, electric powers or instantaneous powers, or else enumerate the number of opening/closing cycles of the circuit breaker D.

To this end, the unit 1 is designed to be connected electrically to the input terminals of the circuit breaker D.

In this example, the circuit breaker D is a multipolar circuit breaker configured to operate with an alternating polyphase, for example three-phase, electric current. In this example, the circuit breaker D thus includes three electrical poles, associated with electrical phases P1, P2 and P3, respectively, and an electrical pole associated with a neutral phase PN.

The monitoring unit 1 includes a central body 10 and a plurality of removable modules 20, 30, 40, 50, 60 and 70. As a variant, the number of modules may be different. Each of these modules is able to perform a particular predefined function, explained in more detail below. Each of the removable modules 20, 30, 40, 50, 60 and 70 is able to be displaced between a position inserted into the central body 10 and a position withdrawn from the central body 10.

In the inserted position, the removable module is received in a corresponding recess of the central body 10 or in a corresponding recess of another removable module, itself already received in the central body 10. The removable module is then connected electrically to components of the unit 1 that are contained in the central body 10.

In the withdrawn position, the removable module is outside the central body 10 and is not connected electrically to a component of the unit 1 contained in the central body 10.

As illustrated in FIG. 3, the central body 10 includes a control device 110 and an interconnection device 120.

The control device 110 is configured to measure the operating state of the circuit breaker D, and in particular the value of the current flowing over time in this circuit breaker D, and to trip the opening of the circuit breaker D when an operating defect is detected during this measurement.

The control device 110 includes a measuring circuit 1101, a shared electric power supply bus 1102, and a signal processing calculating unit 1104, which are arranged in this case on an electronic board 1103 of the control device 110.

The electronic board 1103 includes a rigid support, for example of the printed circuit board (PCB) kind. This electronic board 1103 extends essentially in a geometric plane P.

In this example, the electronic board 1103 extends over the entire length of the control device 110 and of the central body 10, the latter having an oblong shape in the geometric plane P. In a configuration in which the monitoring unit 1 is assembled with the circuit breaker D, the geometric plane P extends in parallel with a front face of the circuit breaker D, in a vertical direction.

The measuring circuit 1101 is designed to measure the value of a voltage that is supplied to one of its outputs and, in response, to deliver a signal representative of the measured voltage value to the calculating unit 1104.

The calculating unit 1104 is programmed to automatically determine an operating state of the circuit breaker on the basis of the measured voltage value. For example, the calculating unit 1104 controls the opening of the circuit breaker D, if the measured voltage value is higher than a predefined threshold, indicating a safety fault, such as an overvoltage or a voltage drop in the circuit breaker D. The calculating unit 1104 in this case includes a programmable microcontroller.

For example, the circuit breaker D is controlled by the control unit 110 by virtue of a wired link, not illustrated, between the control unit 110 and a dedicated interface of the circuit breaker D.

The shared electric power supply bus 1102 is configured to distribute an electric power supply to the various elements of the control device 110, such as the control circuit 1101 or the calculating unit 1104. The power supply bus 1102 is also configured to distribute an electric power supply to the additional modules 30, 40, 50 and 60 in order to ensure the operation thereof when the latter are in the inserted position.

The interconnection device 120 is configured to be connected electrically to the circuit breaker D so as to collect primary electrical voltages V1 coming from the circuit breaker D that are associated with the power terminals of the circuit breaker D. This connection is produced in this case by means of a wire-to-board connector 130.

In this description, "primary voltage" denotes electrical voltages whose maximum amplitude is greater than or equal to 100 volts or 240 volts or 400 volts. These primary electrical voltages correspond to those coming from the circuit breaker D.

By way of illustration, in this example, the circuit breaker D is a low-voltage, high-current circuit breaker designed to operate with electrical voltages having a maximum amplitude of less than or equal to 690 volts AC. In this case, these primary voltages V1 are differences in electrical potential between two phases of the polyphase electric current, and are therefore polyphase themselves.

In this description, the term "secondary voltage" denotes an AC or DC voltage whose maximum amplitude is less than or equal to 20 volts or 30 volts.

The primary voltages V1 originating from the circuit breaker D during the operation thereof are typically too high to supply power directly to the control device 110. The measuring circuit 1101 is thus not able to receive the primary voltages V1 directly at the input. The primary voltages V1 must therefore be transformed into a secondary voltage beforehand. Moreover, the primary voltages, on account of their high value, pose an electrical safety risk for a user of the unit 1 if said user comes into contact with them.

The interconnection device 120 therefore also has the function of being connected electrically to the circuit breaker D in order to collect the primary voltages V1 and to generate secondary voltages V2 from these primary voltages V1, and of supplying the generated secondary voltages V2 to the measuring circuit 1101. The interconnection device 120 furthermore has the function of sharing these collected primary voltages V1 with the removable power supply module 20 when the latter is in a position inserted into the central body 10.

The power supply module 20, for its part, is configured to convert the primary voltages V1 to an additional secondary voltage V2', also termed additional secondary voltage, for supplying power to the control device 110. The additional secondary voltage V2' is not necessarily identical to the secondary voltage V2 supplied by the interconnection device 120.

Figure 1:
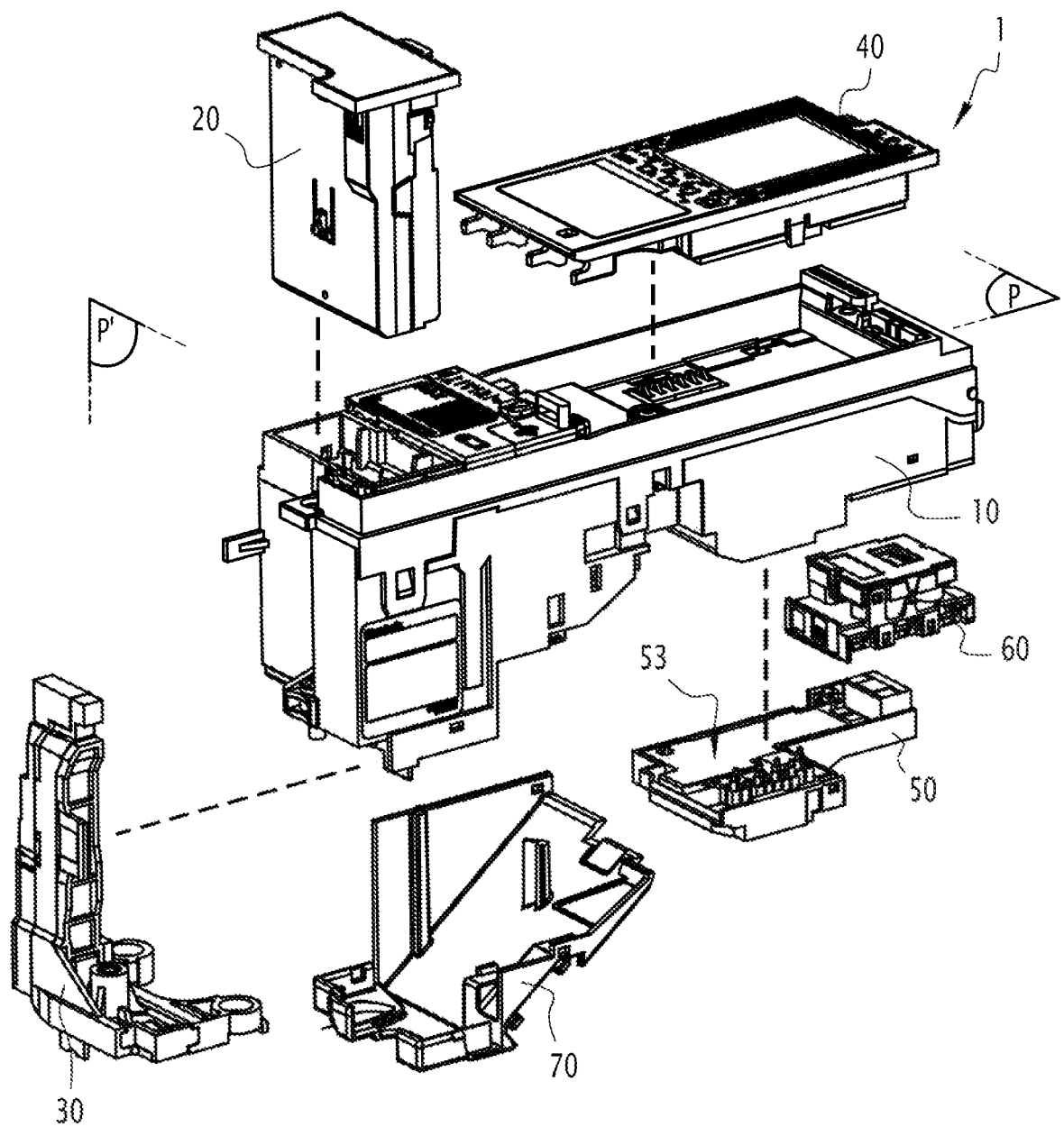
FIG. 1 is a schematic representation, in an exploded view, of a monitoring unit for monitoring a multipolar electrical circuit breaker according to the invention.
Figure 2:
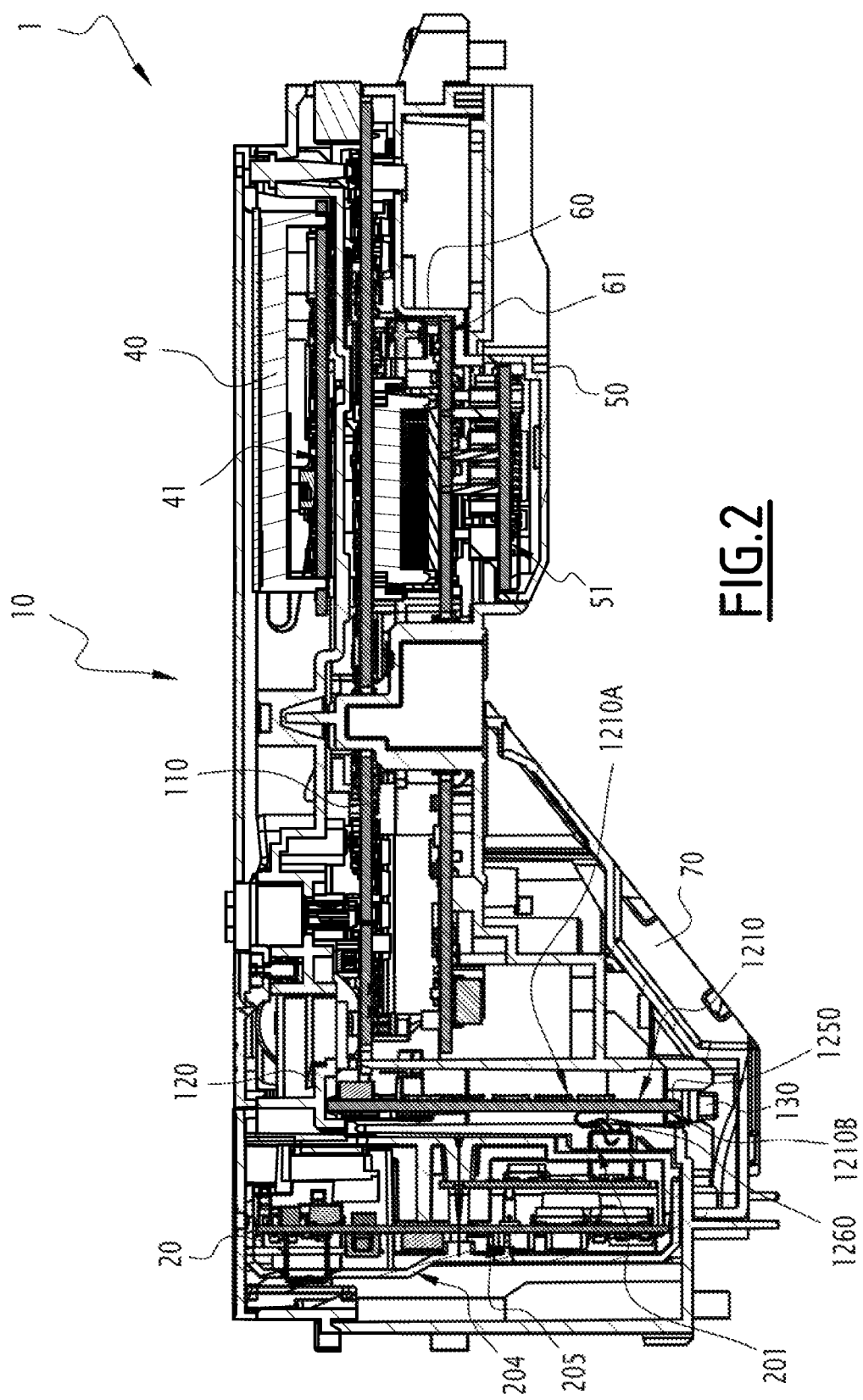
FIG. 2 is a schematic representation, in a cross-sectional view, of the monitoring unit from FIG. 1 in an assembled configuration.

To this end, the removable power supply module 20 includes a primary connection interface 201, a secondary connection interface 202 and a power converter 203, which are fastened on a rigid support 205 in this case (FIG. 2) and housed inside a housing 204 (FIG. 2) of the removable power supply module 20.

The support 205 has in this case a flat shape and extends in a geometric plane P' perpendicular to the geometric plane P. The geometric plane P' corresponds to a horizontal plane when the unit 1 is in a configuration in which it is assembled with the circuit breaker D.

The power converter 203 is designed to transform a primary voltage V1 received from the primary connection interface 201 into an additional secondary voltage V2', which is then delivered to the secondary connection interface 202. For example, the power converter 203 is a voltage transformer.

In this example, the power supply bus 1102 is configured to be supplied with power by an additional secondary DC voltage V2' having an amplitude equal to 24 volts. The power supply bus 1102 advantageously includes additional power converters that are designed to transform this additional secondary voltage V2' into a DC voltage of lower value, for example equal to 3.3 volts, with a view to supplying power to certain elements of the control device 110.

When the removable power supply module 20 is in a position inserted into the central body 10, the primary 201 and secondary 202 connection interfaces are connected to the interconnection device 120 and to the control device 110, respectively. In contrast, in the withdrawn position, the primary 201 and secondary 202 connection interfaces are disconnected from the interconnection device 120 and from the control device 110, respectively.

The power supply bus 1102 is designed to be provided with a secondary voltage supplied by the module 20 when the latter is in the inserted position. Nevertheless, the bus 1102 is advantageously designed to continue to be provided with power when the module 20 is withdrawn from the central body 10.

For example, this provision is performed by the power supply module 20 when the latter is present within the unit 1. Nevertheless, the power supply bus 1102 is also designed to be provided with a voltage coming from an auxiliary power source S (FIG. 3). These auxiliary power sources S may be used in addition to or as a replacement for the power supply module.

A first example of an auxiliary power source S is a current sensor integrated within the circuit breaker, such as a current transformer, which generates a voltage from the electric power current that flows within the circuit breaker. A source of this kind, in a known manner, functions only when the circuit breaker is in the closed state and an electric current flows between the input and output terminals of the circuit breaker.

A second example of an auxiliary power source S is a backup battery, not illustrated, incorporated within the monitoring unit 1.

A third example of an auxiliary power source S may be an auxiliary power supply module linked to an external electric power supply, for example coming from the electrical panel in which the unit 1 and the circuit breaker D are installed. This electrical source may be associated with an inverter or with a backup power supply.

A fourth example of an auxiliary power source S is provided by a user of the unit 1 by means of a USB (universal serial bus) data link, for example when this user connects a computer terminal to the control device 110 in order to perform diagnostic maintenance operations on the monitoring unit 1.

FIGS. 4 to 9 illustrate the interconnection device 120 in greater detail.

Figure 4:
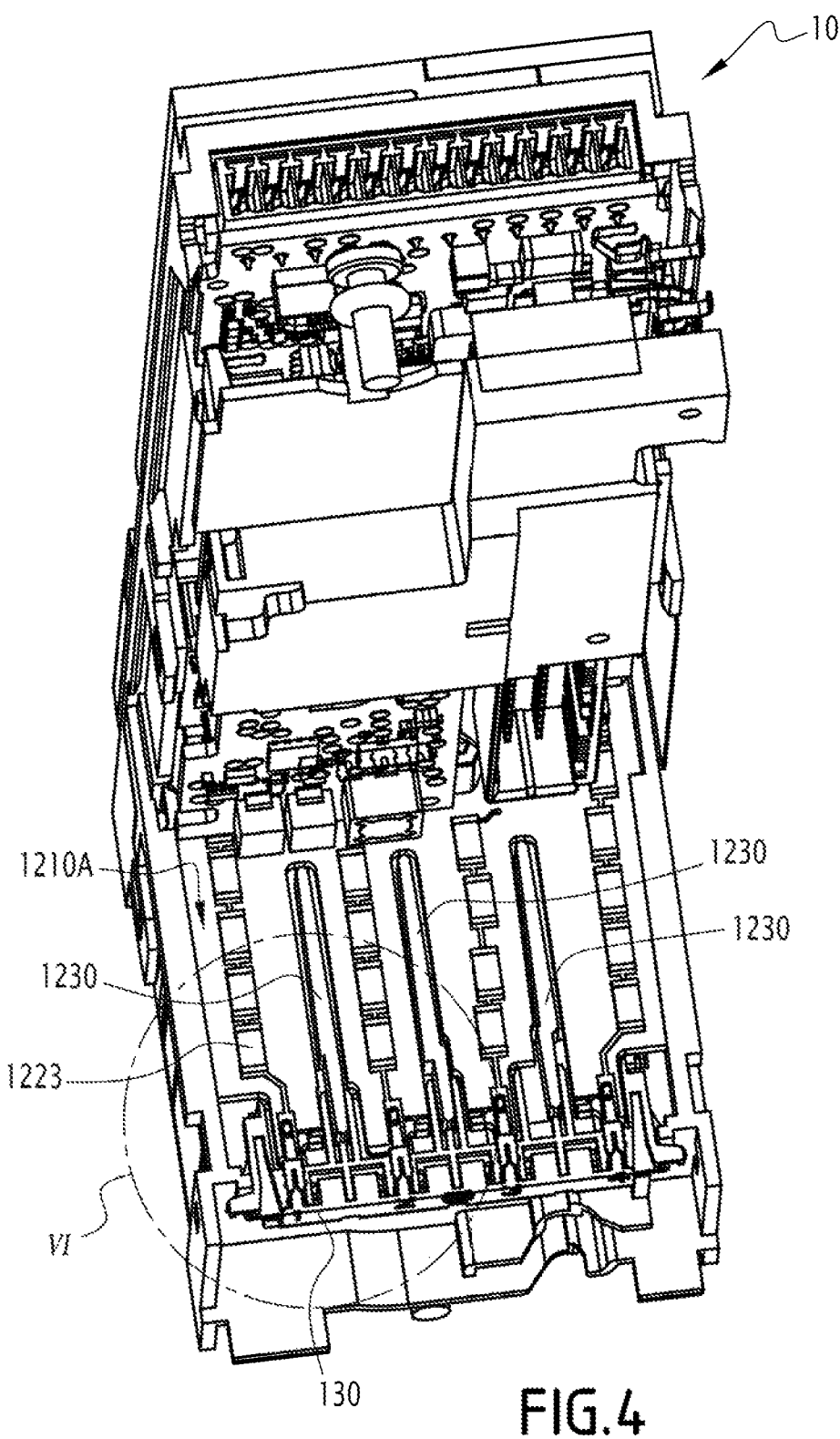
FIG. 4 is a schematic representation, in a perspective view, of an interconnection device included in a central body of the monitoring unit from FIGS. 1 and 2.

As illustrated in FIGS. 3 and 4, the interconnection device 120 includes input contact pads 1221 that are able to be connected electrically to power input terminal pads of the multipolar electrical circuit breaker D so as to receive the primary electrical voltages from the circuit breaker D. For example, the interconnection device 120 includes four input contact pads 1221, each associated with one of the electrical phases P1, P2, P3 and with the neutral phase PN.

This interconnection with the input terminals of the circuit breaker D is achieved by means of a wire-to-board connector 130, which is described hereinafter.

The interconnection device 120 also includes output contact pads 1222 that are connected electrically to the measuring circuit 1101 by means of wired connections, not illustrated.

The interconnection device 120 furthermore includes an electrical power circuit 1220 connected between the input contact pads 1221 and the output contact pads 1222. This electrical power circuit 1220 is in this case a voltage divider bridge formed by a plurality of electrical resistors 1223 and 1223'.

The connection device 120 in this case includes a flat support 1210 on which the electrical power circuit 1220, the input contact pads 1221 and the output contact pads 1222 are formed. The support 1210 is rigid, for example.

The support 1210 extends in this case in the geometric plane P'. A first face of the support 1210 is denoted "1210A", and a second face of the support 1210, which is opposite the first face 1210A, is denoted "1210B".

The input contact pads 1221 are arranged on the first face 1210A, at an edge of the support 1210. The output contact pads 1222 are also formed on the first face 1210A, at a location separate from that of the input contact pads 1221.

The resistors 1223 are arranged on the first face 1210A, while the resistors 1223' are arranged on the second face 1210B. The resistors 1223 and 1223' are identical in this case.

The resistors 1223 are arranged so as to form branches of the divider bridge of the power circuit 1220, each branch being associated with one of the electrical phases P1, P2, P3 and PN. More precisely, the resistors 1223 and 1223', within each branch of the power circuit 1220, are connected electrically to one another and to the input 1221 and output 1222 contact pads by means of electrically conductive tracks arranged on the corresponding first and second faces 1210A and 1210B of the support 1210. The position of each resistor 1223, 1223' makes it possible to guarantee electrical isolation between one another and between each branch.

In this example, the support 1210 includes a main part, extending from which are four longitudinal elongations, or branches, in parallel with one another and separated by spacings 1210E, such that the support 1210 is in the shape of an E with four branches. Each of the branches is associated with an electrical phase of the circuit P1, P2, P3 and PN. Each branch thus includes a single input contact pad 1221, and also includes the resistors 1223 that are associated with this electrical phase. The output contact pads 1222 are arranged next to one another on the main part of the support 1210.

The neutral phase PN is preferably associated with one of the central branches of the support 1210, and not positioned on one of the branches which are situated on outer edges of the support 1210. In this way, there are at least two separate electrical phases P1, P2 and P3 that are separated from one another by the neutral phase PN, thereby improving electrical safety, in particular with regard to the formation of an electrical arc between the connectors of these various phases.

In this example, five or six resistors 1223, 1223' are used for each of the electrical phases P1, P2, P3 and PN. As a variant, this number may be different. In particular, the resistors 1223' that are arranged on the second face 1210B may be omitted. They are typically arranged on this face 1210B when there is not enough space to accommodate them on the first face 1210A.

For example, the support 1210 has a length D1 equal to 40 mm and a width D2 equal to 54 mm. This length and this width are measured in this case in the plane of the support 1210.

The interconnection device 110 also includes partitions, or longitudinal insulation screens 1230, which are arranged along the face 1210A of the support 1210, starting from the edge of the support 1210 and extending perpendicularly with respect to the support 1210. There are three of these longitudinal screens 1230 in this case, and they are identical.

The height of each screen 1230 is advantageously greater than or equal to 8 mm or 8.5 mm.

The insulation screens 1230 advantageously extend over at least 50% of the length of the support 1210, preferably at least 80% of the length of the support 1210.

These insulation screens 1230 are made of an electrically insulating, high-temperature resistant and fireproof material, for example of plastic such as crosslinked polyamide, or of glass fibre-reinforced polycarbonate. Use is made of crosslinked polyamide 6.6, also denoted "PA 6.6", or of polycarbonate PC GF10, for example.

In this example, the screens 1230 are integral with a housing of the central body 10. Each insulation screen 1230 is received inside a cutout 1210E in the support 1210 that separates the parallel branches of the support 1210. Thus, in this example, the screens 1230 are separate from the support 1210.

As a variant, nevertheless, the screens 1230 may be arranged directly on the support 1210.

The insulation screens 1230 thus have a shape complementary to that of the spacings 1210E of the support 1210.

The screens 1230 thus separate the input contact pads 1221 transversely from one another. Furthermore, on account of the fact that these screens 1230 extend over the length of the support 1210, they separate the rows of resistors 1223 of the power circuit 1220 that are arranged on the face 1210A transversely from one another.

The longitudinal screens 1230 thus create an electrically insulating barrier that is intercalated between the input contact pads 1221 associated with the electrical phases P1, P2, P3 and PN and that increases the point-to-point distance between these input contact pads 1221.

Moreover, by virtue of their length, the longitudinal screens 1230 increase the leakage path distance between these input contact pads 1221. The same applies with respect to the branches of the power circuit 1220.

The risk of a short circuit occurring between input contact pads 1221 or branches of the power circuit 1220 associated with different electrical phases P1, P2, P3 and PN in the primary area of the interconnection device 120, that is to say the area situated in the vicinity of the primary voltages V1, is thus considerably reduced. Indeed, the safety of the unit 1 is improved.

The concepts of creepage distance and leakage paths are well known to those skilled in the art and are defined, for example, in greater detail in the IEC 60335 standard from the International Electrotechnical Commission. For example, the creepage distance corresponds to the point-to-point distance between two electrical contacts, while the leakage path corresponds to the shortest distance between these two electrical contacts achieved by travelling along the various materials situated between these two electrical contacts.

This is provided through the dimensioning of the screens 1230. By virtue of the screens 1230, and in particular of their height, with respect to the dimensions of the recess in which the support 1210 of the interconnection device 120 is received within the central body 10, the formation of direct creepage paths between two consecutive input contact pads 1221 is prevented, as the latter are electrically separated from one another by the screens 1230. Moreover, by virtue of the length of these screens 1230, the length of the leakage paths that is permitted within this face 1210A is greater than or equal to 28 mm or 32 mm.

Figure 6:
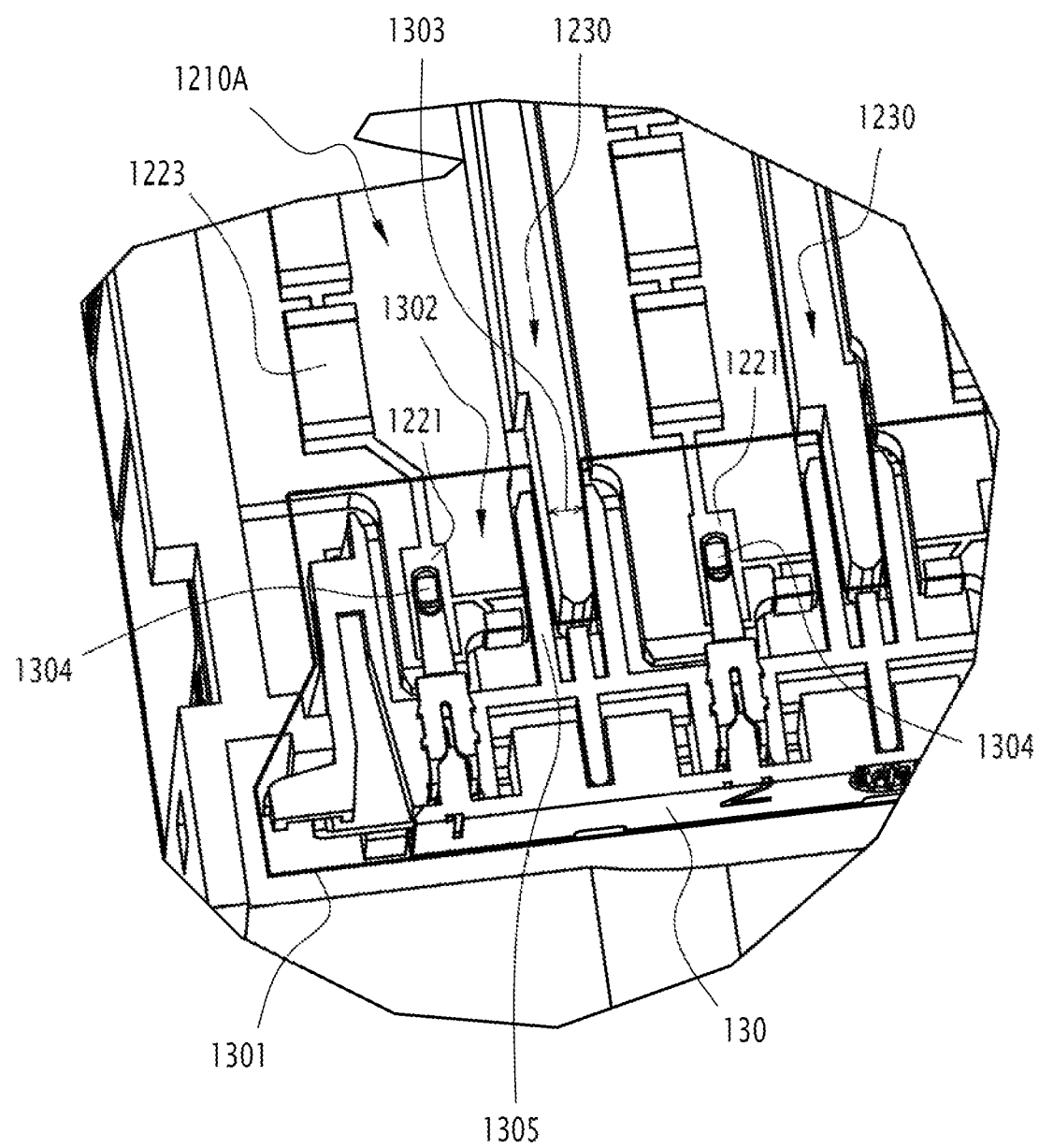
FIG. 6 is a close-up view of the interconnection device from FIG. 4, mounted on which is a wire-to-board connector, illustrated in a stripped-down view.

As illustrated in FIG. 6, the wire-to-board connector 130 includes a housing 1301, inside which are formed separate recesses 1302 that are separated from one another by external spacings 1303 over part of their length. The external spacings 1303 have a shape complementary to the ends of the longitudinal insulation screens 1230.

Each of the recesses 1302 of the connector 130 contains an electrical connection strip 1304, intended to come into contact with a corresponding input contact pad 1221. This contact strip 1304 is linked electrically to an electrical cable, which is itself connected electrically to a corresponding power input terminal of the circuit breaker D.

In this example, the connector 130 includes four recesses 1302, each containing a strip 1304 each associated with one of the electrical phases P1, P2, P3 and PN.

The connector 130 also includes aligning elements 1305, which enable the connector 130 to be guided and positioned on the edge of the support 1210.

The connector 130 is removable, that it to say that it is able to be reversibly and selectively displaced between a connected position and a disconnected position.

In this example, the connector 130, on account in particular of its shape, is able to be inserted into its connected position only if it is oriented in a predefined direction, thus providing an error prevention function.

In the connected configuration, the ends of the branches of the support 1210 are received inside the corresponding recesses 1302. The input contact pads 1210 positioned on these ends of the branches of the support 1210 are themselves also received inside the corresponding recesses 1302 and are in electrical contact with the electrical strips 1304, so as to ensure an electrical connection with the corresponding terminals of the circuit breaker D. In this connected position, the ends of the screens 1230 are received inside the external spacings 1303.

In FIG. 6, for ease of reading, the housing 1301 is not illustrated in its entirety, and only its external profile is shown schematically by a solid line.

In the disconnected state of the connector 130, the ends of the branches of the support 1210, and the input contact pads 1221, are situated outside the recesses 1302. Likewise, the strips 1304 are disconnected from the contact pads 1221, thus preventing an electrical connection between the terminals of the circuit breaker D and the interconnection device 120.

By virtue of the positioning of the connector 130, and in particular of the interaction between the spacings 1303 and the ends of the screens 1230, the length of the leakage path that must be covered to electrically link the input contact pads 1221 in ambient air is increased. This reduces the risk of the formation of a short circuit between contact pads 1221 or adjacent strips 1304 that are associated with electrical phases P1, P2, P3 even further. In particular, the length L of the leakage paths between two strips 1304 is in this case greater than or equal to 28 mm or, preferably, 32 mm.

Figure 5:
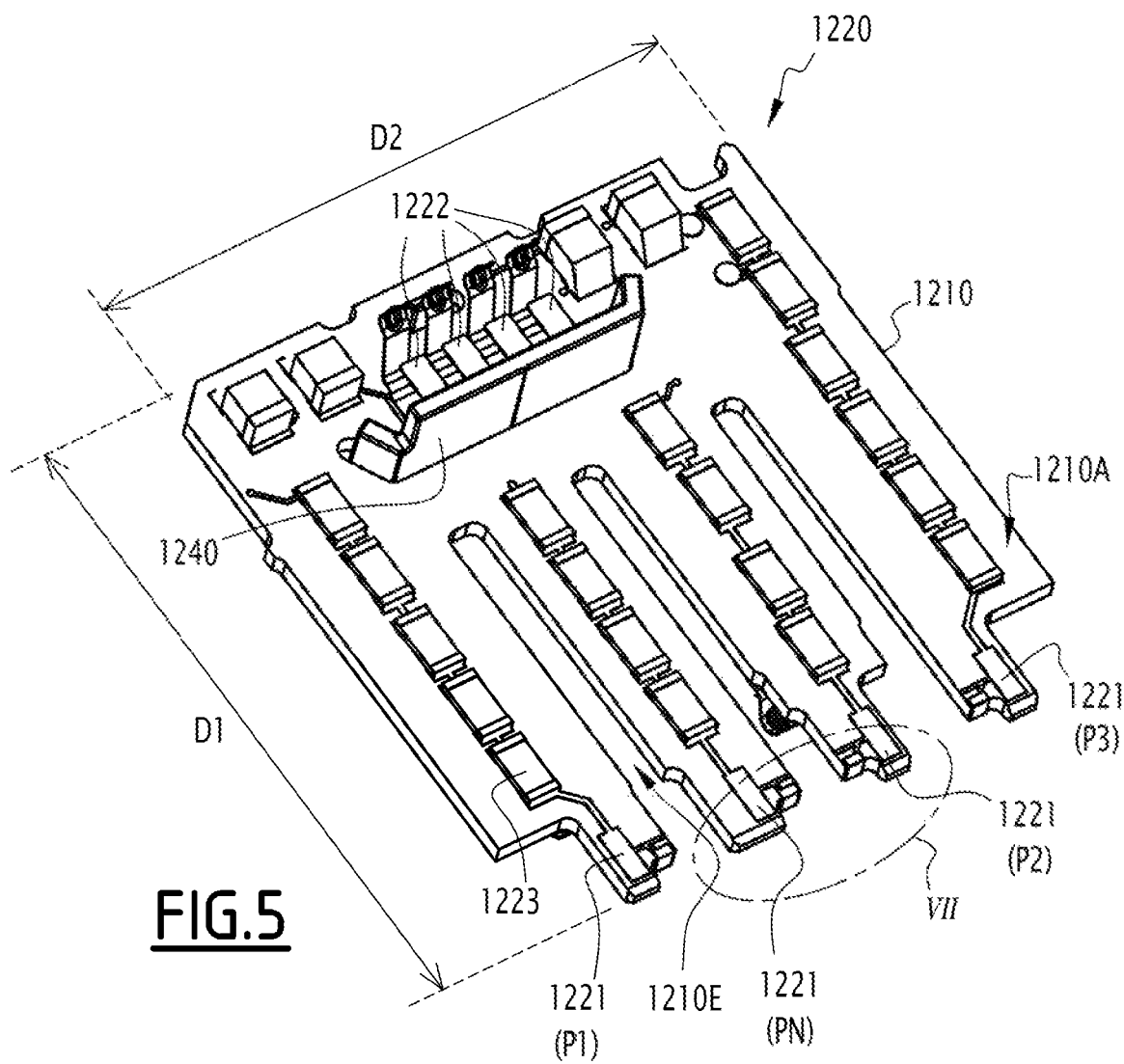
FIG. 5 is a schematic representation of a first face of the interconnection device from FIG. 4.

The interconnection device 120 advantageously also includes an insulation wall 1240, illustrated in FIG. 5, which is intercalated between the input contact pads 1221 and the output contact pads 1222. This wall 1240 extends perpendicularly with respect to the face 1210A.

The wall 1240 is in this case made of an electrically insulating material, for example of plastic, such as the crosslinked polyamide PA 66 or the glass fibre-reinforced polycarbonate PC GF10 that were described previously.

In this example, the wall 1240 is arranged directly on the face 1210A of the support 1210, on the main part of the support 1210. This wall 1240 has an essentially flat central part, and lateral flaps that are inclined with respect to the central part, so as to surround the area of the face 1210A of the support 1210 on which the electrical contacts 1222 are arranged.

For example, the wall 1240 has a light colour, such as white or grey, to facilitate the automatic detection thereof during manufacturing steps performed by a manufacturing device.

The wall 1240 has a height, measured perpendicularly to the surface of the face 1210A, that is to say perpendicularly to the geometric plane P', that is greater than or equal to 50%, or preferably 80%, or more preferably 90%, of the free distance between the face 1210A and a cover at least partially covering this face 1210A, this cover forming part of the central body 10.

When the interconnection device 120 is in an assembled configuration within the central body 10, the wall 1240 thus prevents the formation of an electrical arc or of a short circuit between one of the input contact pads 1221 and one of the output contact pads 1222. This is achieved by virtue of the fact that the wall 1240 has a height that is sufficient to be intercalated on the creepage path linking each of the input contact pads 1221 to each of the output contact pads 1222. Improved electrical insulation between the primary voltages and the secondary voltages is thus ensured.

Specifically, the modular design of the unit 1 makes it possible to ensure a satisfactory compactness and bulk of the unit 1. Nevertheless, such compactness of the unit 1 introduces a risk of short-circuiting between the zones of the interconnection device 120 that are exposed to the primary voltage V1 and the zones of the interconnection device 120 that are exposed to the secondary voltage V2, as these zones are closer to one another on account of this compactness.

By virtue of the wall 1240, the creepage distance that must be covered to electrically link these two zones, for an electrical arc for example, is increased. This reduces the risk of such a short circuit occurring, and increases the electrical safety of the unit 1.

In particular, by virtue of the wall 1240, the creepage distance between a contact pad 1221 and a contact pad 1222 is greater than or equal to 25 mm. Likewise, the leakage path distance between an input contact pad 1221 and a contact pad 1222 is greater than or equal to 28 mm, preferably 32 mm. As a variant, this distance may be different, depending on the materials used to form the support 1210 and the wall 1240.

Figure 7:
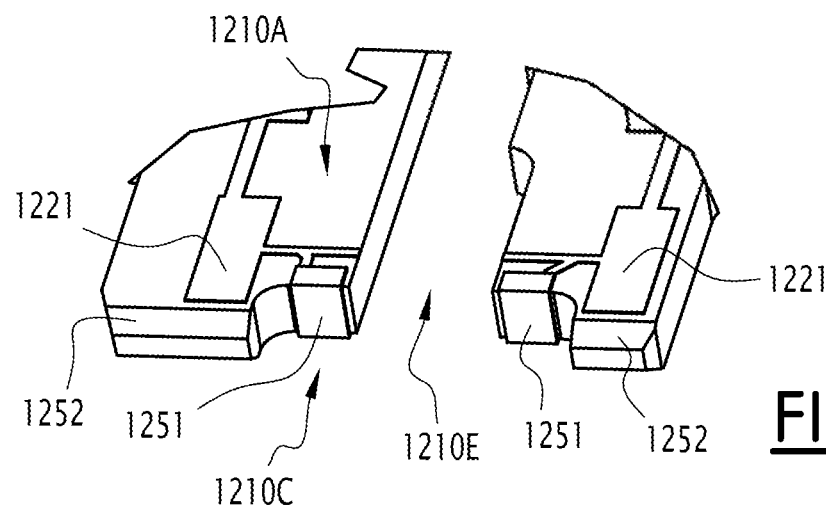
FIG. 7 is a schematic representation, in a close-up view, of an edge of the interconnection device from FIG. 5.

As illustrated in FIG. 7, the support 1210 advantageously includes gildings 1251 made of an electrically conductive material, such as gold, which are arranged on a portion 1210C perpendicular to the lateral edge of the support 1210. This portion 1210C extends perpendicularly to the faces 1210A and 1210B.

Each of the gildings 1251 is linked electrically to an input contact pad 1221 by means of an electrically conductive track arranged on the face 1210A. The role of these gildings 1251 is to enable an operating test of the circuit 1220 during a step of manufacturing the unit 1. This test is typically performed by means of an automated testing device, for which the positioning of the gildings on the portion 1210C enables an easier electrical connection than having to connect to the contact pads 1221.

As illustrated in FIG. 7, the support 1210 advantageously includes chamfers 1252 that are arranged on edges of the support 1210 on the portion 1210C. These chamfers 1252 enable the connector 130 to be guided and fastened more easily.

Figure 8:
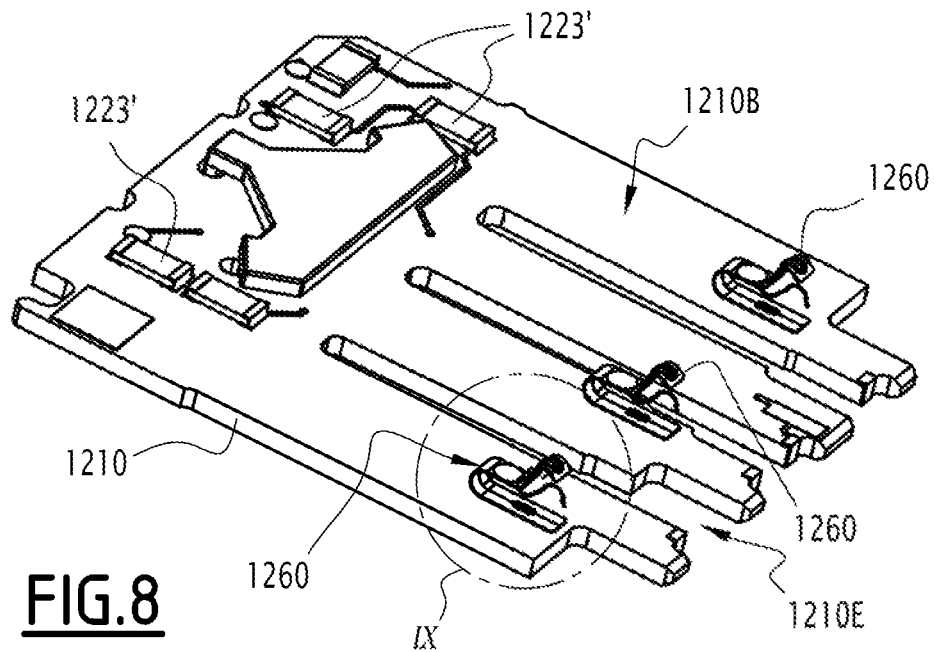
FIG. 8 is a schematic representation of a second, opposite face of the interconnection device from FIG. 5.

FIG. 8 shows the second face 1210B of the interconnection device 120.

The interconnection device 120 includes unitary flexible-strip electrical connectors 1260 that are designed to ensure the electrical connection between the interconnection device 120 and the primary interconnection interface 201 of the removable power supply module 20 when this removable power supply module 20 is in its position inserted into the central body 10.

In this example, the interconnection device 120 includes three flexible connectors 1260, each associated with one of the electrical phases P1, P2 and P3. In particular, no flexible connector 260 is associated with the neutral phase PN.

Each connector 1260 is fastened integrally to the support 1210, on the second face 1210B, at an end of the corresponding branch of the support 1210. The connector 1260 is for example welded to the face 1210B of the support 1210 by means of welding or brazing.

The connectors 1260 are aligned with one another and are remote from one another. The connector 1260 situated on the central branches is preferably offset in the direction of alignment of the connectors 1260, such that it is not positioned too close to the immediately adjacent connector 1260.

Each of the connectors 1260 is linked electrically to the corresponding input contact pad 1221 situated on the opposite face 1210A, for example by means of a through-connection formed through the support 1210.

Figure 9:
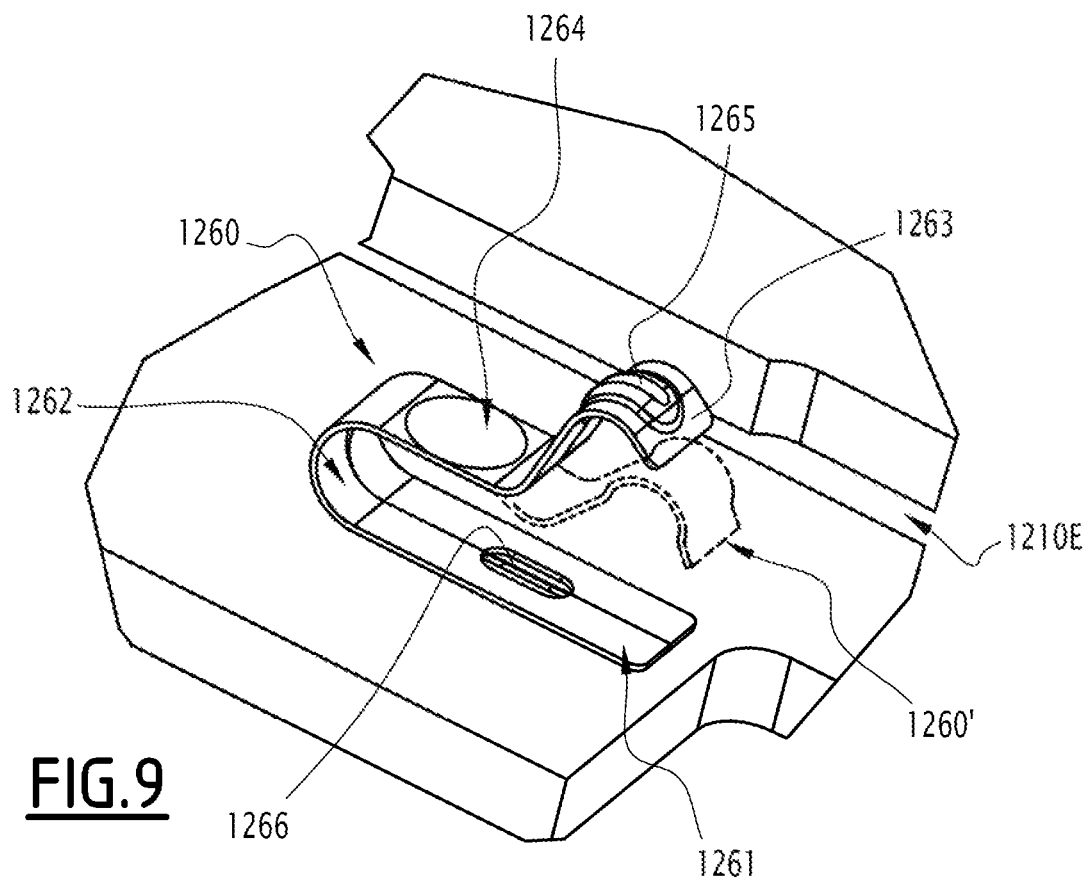
FIG. 9 is a schematic representation, in a close-up view, of an electrical connector of the interconnection device from FIG. 8.

As illustrated in FIG. 9, each connector 1260 includes a fixed base 1261 integral with the face 1210B of the support 1210, a curved part 1262, for example in the shape of a C, and a deformable upper part 1263.

The upper part 1263 is elastically and reversibly deformable between a depressed position and a released position.

In FIG. 9, the connector 1260 is illustrated in its rest position. The dotted lines 1260' show the position of the profile of the upper part 1263 when the latter is in its depressed position. The connector 1260 is in this case in the depressed position when the removable power supply module 20 is in the inserted position.

The connection to the primary connection interface 201 of the power supply module 20 is produced through contact with the upper part 1263. For example, the primary connection interface 201 of the power supply module 20 includes a rigid plate made of an electrically conductive material. When the power supply module 20 is in a position inserted into the central body 10, each plate of the primary connection interface 201 is pressed onto the upper part 1263 so as to deform it into its depressed position in order to ensure electrical conduction.

The curved part 1262 advantageously includes a flat area 1264. For example, these dimensions of this flat area 1264 are such that it is possible to inscribe thereon a disc having a diameter greater than or equal to 2 mm. A flat part 1264 of this kind enables the connector 1260 to be gripped more easily by an automatic placement machine, the latter typically being fitted with a gripping element that is equipped with a vacuum nozzle or with a suction pad. The positioning of the connectors 1260 on the support 1210 is thus simplified during a step of industrially manufacturing the unit 1.

The upper part 1263 advantageously comprises a boss 1265 that projects with respect to the upper part 1263, towards the outside of the connector 1260, that is to say opposite the base 1261.

This boss 1265 makes it possible to ensure improved electrical contact with the primary connection interface 201, in particular to ensure a punctiform electrical contact. The risk of a contact failure and therefore of a power supply module 20 malfunction is thus reduced. The reliability of the unit 1 is thus increased.

The base 1261 advantageously includes an oblong through-orifice 1266 that has a circumference greater than or equal to 4.5 mm.

Such an orifice 1266 makes it possible to ensure that the welding or brazing material used to weld the connector 1260 to the support 1210 rises. This material thus rises on the walls of the orifice 1266 as far as an upper face of the base 1261. The quality of the electrical contact between the connector 1260 and the input contact pad 1221 is thus improved.

The connector 1260 is in this case made of metal, preferably of a copper-beryllium alloy. Such a copper-beryllium alloy has the advantage of providing good elasticity while having satisfactory electrically conductive properties. On account of this good elasticity, the risk of plastic, that is to say irreversible, deformation of the upper part 1263 when the latter is subjected to significant and repeated deformations between these two positions is limited. The durability and the reliability of the unit 1 are thus improved.

By virtue of the connectors 1260, it is not necessary to resort to wired connections or to pin connectors provided with unwieldy housings to ensure the connection of the module 20.

In a general manner, by virtue of the interconnection device 120, the electrical connections within the central body 10 are produced either by virtue of electrically conductive tracks that are arranged on supports, or by virtue of unitary connectors. It is therefore not necessary to use wires or wired connections within the unit 1. This firstly reduces its bulk and, secondly makes it possible to provide a modular structure in which modules may be selectively withdrawn or added by a user of the unit 1 during the operation of the unit 1 in a simplified manner, without it being necessary to modify the wiring each time.

These connectors are also designed to support a high number of cycles of insertion and withdrawal of the various modules, ensuring a satisfactory longevity of the unit 1.

In this example, the unit 1 furthermore includes a configuration module 30, a user interface module 40, a short-circuit detection module 50, an additional module 60 and a cover 70. In this example, each of these modules includes an electronic board and piston-type connectors for producing the data and/or electric power supply links to the control device of the central body 10.

Electronic boards associated with the module 40, 50, 60 are respectively denoted 41, 51, 61. These electronic boards are in this case arranged in parallel with the plane P when the monitoring unit 1 is in an assembled configuration. The module 30 in this case also includes an electronic board, not illustrated. The module 50 advantageously includes an electrically insulating screen 53 that covers the electronic board 51. This makes it possible to protect this electronic board 51 when the module 50 is withdrawn from the central body 10, while having a smaller bulk than a plastic housing.

The embodiments and the variants contemplated above may be combined with one another so as to create new embodiments.

The invention claimed is:

1. A monitoring unit for monitoring a multipolar electrical circuit breaker, comprising:
   a central body including:
   an interconnection device comprising:
   input contact pads configured to be connected electrically to power input terminals of a multipolar electrical circuit breaker, to receive primary electrical voltages from the circuit breaker, an electrical power circuit including a voltage divider bridge, configured to convert the primary electrical voltages to secondary electrical voltages;

a control device, provided with a measuring circuit configured to measure the secondary electrical voltages supplied by the electrical power circuit, the control device being configured to determine an operating state of the circuit breaker depending on the secondary electrical voltages measured by the measuring circuit;

a separately removable electric power supply module, received in a recess of the central body, the removable electric power supply module:

being connected electrically to the interconnection device in order to collect the primary electrical voltages, and comprising a power converter, configured to transform the collected primary electrical voltages into an additional secondary voltage and to supply electric power to a shared electric power supply bus of the control device using this additional secondary voltage; and an auxiliary power source configured to supply electric power to the shared electric power supply bus of the control device, when the separately removable electric power supply module is removed, to avoid affecting operation of the control device to determine the operation state of the circuit breaker.

2. The monitoring unit according to claim 1, wherein the interconnection device includes a support on which the electrical power circuit is arranged, the input contact pads being positioned on an edge of the support, and the interconnection device includes longitudinal insulation screens arranged along the support, starting from said edge of the support and extending perpendicularly with respect to the plane of the support, to separate the input contact pads transversely from one another.

3. The monitoring unit according to claim 2, wherein the longitudinal insulation screens extend over at least 50% of the length of the support.

4. The monitoring unit according to claim 2, wherein the divider bridge includes electrical resistors linked electrically to one another along rows to form separate branches of the electrical power circuit, each branch being associated with an electrical phase, and the longitudinal insulation screens extend in parallel with the rows of resistors to separate these branches transversely from one another.

5. The monitoring unit according to claim 2, wherein the unit includes a removable wire-to-board connector configured to electrically connect the input contact pads to electrical cables that are to be connected electrically to power input terminals of the circuit breaker, the wire-to-board connector including a housing in which recesses are formed, inside which recesses the input contact pads are received when the connector is in a position connected to the interconnection device, the recesses being separated from one another over part of their length by external spacings having a shape that is complementary to the longitudinal insulation screens.

6. The monitoring unit according to claim 1, wherein the interconnection device includes:

output contact pads of the electrical power circuit, arranged on the same face of the support as the input contact pads, and an insulation wall intercalated between the input contact pads and the output contact pads and extending perpendicularly to said face.

7. The monitoring unit according to claim 1, wherein the interconnection device includes unitary flexible-strip electrical connectors configured to be connected electrically to a primary connection interface of the removable power supply module.

8. The monitoring unit according to claim 7, wherein the unitary flexible-strip connectors are made of a copper-beryllium alloy.

9. The monitoring unit according to claim 1, further comprising additional removable modules configured to be connected electrically to the control device, the monitoring unit including electrical piston connectors that are configured to be connected to corresponding connectors fitted on these additional modules.

10. A multipolar electrical circuit breaker including a monitoring unit to monitor the circuit breaker, wherein the monitoring unit is in accordance with claim 1, the interconnection device being connected electrically to power terminals of the circuit breaker.

11. The monitoring unit according to claim 1, wherein the auxiliary power source is a current sensor disposed in the circuit breaker.

12. The monitoring unit according to claim 1, wherein the auxiliary power source is a backup battery.

13. The monitoring unit according to claim 1, wherein the auxiliary power source is a power supply module that is connected to an external power source external to the monitoring unit.

14. The monitoring unit according to claim 1, wherein the auxiliary power source is a universal serial bus (USB) data link.

* * * * *